United States Patent
Zhou et al.

(10) Patent No.: US 8,381,801 B2
(45) Date of Patent: *Feb. 26, 2013

(54) HEAT DISSIPATION DEVICE

(75) Inventors: Zhi-Yong Zhou, Shenzhen (CN); Ji-Yun Qin, Shenzhen (CN); Hao-Xia Liu, Shenzhen (CN)

(73) Assignees: Fu Zhun Precision Industry (Shen Zhen) Co., Ltd., Shenzhen (CN); Foxconn Technology Co., Ltd., New Taipei (TW)

( * ) Notice: Subject to any disclaimer, the term of this patent is extended or adjusted under 35 U.S.C. 154(b) by 448 days.

This patent is subject to a terminal disclaimer.

(21) Appl. No.: 12/494,342

(22) Filed: Jun. 30, 2009

(65) Prior Publication Data

US 2010/0206522 A1    Aug. 19, 2010

(30) Foreign Application Priority Data

Feb. 17, 2009   (CN) .......................... 2009 1 0300447

(51) Int. Cl.
    *F28D 15/00* (2006.01)
(52) U.S. Cl. .............. 165/104.26; 165/104.33; 361/700; 361/704
(58) Field of Classification Search .................. 165/80.2, 165/80.3, 104.33, 104.26; 361/697, 700
    See application file for complete search history.

(56) References Cited

U.S. PATENT DOCUMENTS

| | | | | |
|---|---|---|---|---|
| 5,875,095 | A * | 2/1999 | Webb .............................. | 361/700 |
| 6,883,594 | B2 * | 4/2005 | Sarraf et al. .............. | 165/104.33 |
| 7,028,758 | B2 * | 4/2006 | Sheng et al. .............. | 165/104.33 |
| 7,251,134 | B2 * | 7/2007 | Liu et al. ........................ | 361/695 |
| 7,254,023 | B2 * | 8/2007 | Lu et al. ........................ | 361/698 |
| 7,284,597 | B2 * | 10/2007 | Tang .............................. | 165/80.3 |
| 7,343,962 | B2 * | 3/2008 | Xia et al. ...................... | 165/80.3 |
| 7,369,412 | B2 * | 5/2008 | Peng et al. .................... | 361/715 |
| 7,461,686 | B2 * | 12/2008 | Fan Chiang .................... | 165/78 |
| 7,637,311 | B2 * | 12/2009 | Zheng et al. .................. | 165/80.3 |
| 7,742,306 | B2 * | 6/2010 | Shuai et al. ................... | 361/710 |
| 7,942,195 | B2 * | 5/2011 | Chen et al. .................... | 165/80.4 |
| 8,069,909 | B2 * | 12/2011 | Qin et al. ...................... | 165/80.3 |
| 2007/0131387 | A1 * | 6/2007 | Kawabata et al. ........... | 165/80.3 |
| 2008/0047140 | A1 * | 2/2008 | Hsu .............................. | 29/890.03 |
| 2008/0055855 | A1 * | 3/2008 | Kamath et al. ................ | 361/700 |
| 2008/0302509 | A1 * | 12/2008 | Chen et al. .................... | 165/80.3 |

(Continued)

FOREIGN PATENT DOCUMENTS

| | | |
|---|---|---|
| CN | 101018464 A | 8/2007 |
| JP | 2005-114341 A | 4/2005 |

(Continued)

*Primary Examiner* — Marc Norman
*Assistant Examiner* — Devon Russell
(74) *Attorney, Agent, or Firm* — Altis Law Group, Inc.

(57) ABSTRACT

A heat dissipation device includes a first heat sink thermally contacting an electronic component, a second heat sink connecting to the first heat sink, and a heat pipe thermally connecting the first heat sink with the second heat sink. The first heat sink defines a receiving portion at a lateral side thereof. The heat pipe includes an evaporating section attached to the first heat sink, a condensing section attached to the second heat sink and a connecting section interconnecting the evaporating section with the condensing section. An engaging portion protrudes from a lateral side of the second heat sink and is firmly embedded in and lockable with the receiving portion of the first heat sink. The heat pipe extends through the engaging portion.

7 Claims, 3 Drawing Sheets

U.S. PATENT DOCUMENTS

| | | | |
|---|---|---|---|
| 2008/0310122 A1* | 12/2008 | Chou et al. | 361/720 |
| 2009/0000768 A1* | 1/2009 | Zheng et al. | 165/80.3 |
| 2009/0151898 A1* | 6/2009 | Lai et al. | 165/80.3 |
| 2009/0151921 A1* | 6/2009 | Lai et al. | 165/185 |
| 2009/0159252 A1* | 6/2009 | Lai et al. | 165/171 |
| 2009/0166000 A1* | 7/2009 | Lai et al. | 165/80.3 |
| 2009/0166007 A1* | 7/2009 | Li et al. | 165/104.33 |
| 2009/0223647 A1* | 9/2009 | Alousi et al. | 165/80.3 |
| 2009/0321054 A1* | 12/2009 | Qin et al. | 165/104.26 |

FOREIGN PATENT DOCUMENTS

TW        200626056 A        7/2006

* cited by examiner

HEAT DISSIPATION DEVICE

BACKGROUND

1. Technical Field

The disclosure generally relates to heat dissipation and, more particularly, to a heat dissipation device incorporating heat pipes.

2. Description of Related Art

Electronic components, such as central processing units (CPUs) comprise numerous circuits operating at high speeds and generating substantial heat. Under most circumstances, it is necessary to cool the CPUs to maintain safe operating conditions and assure that the CPUs function properly and reliably. In the past, various approaches have been used to cool electronic components. Typically, a finned metal heat sink is attached to an outer face of the CPU to remove the heat therefrom. The heat absorbed by the heat sink is then dissipated to ambient air. The heat sink is made of highly heat-conductive metal, such as copper or aluminum, and generally comprises a base contacting the CPU to absorb heat therefrom and a plurality of fins formed on the base for dissipating the heat. However, as the operating speed of electronic components increases markedly in the current environment, heat dissipation only using metal conduction may be insufficient for the amount of heat generated. Heat on the bottom of the metal heat sink cannot be transferred to the whole device quickly enough, and especially not to the fins separate from the bottom of the metal heat sink.

Heat pipes, which operate by phase change of working liquid sealed therein, have been widely used due to their excellent heat transfer properties. Accordingly, heat dissipation devices equipped with heat pipes appear in many current applications and are widely used, with optimal performance thereof towards a common goal in current R & D efforts.

What is needed, therefore, is a heat dissipation device incorporating heat pipes with enhanced heat dissipation performance.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
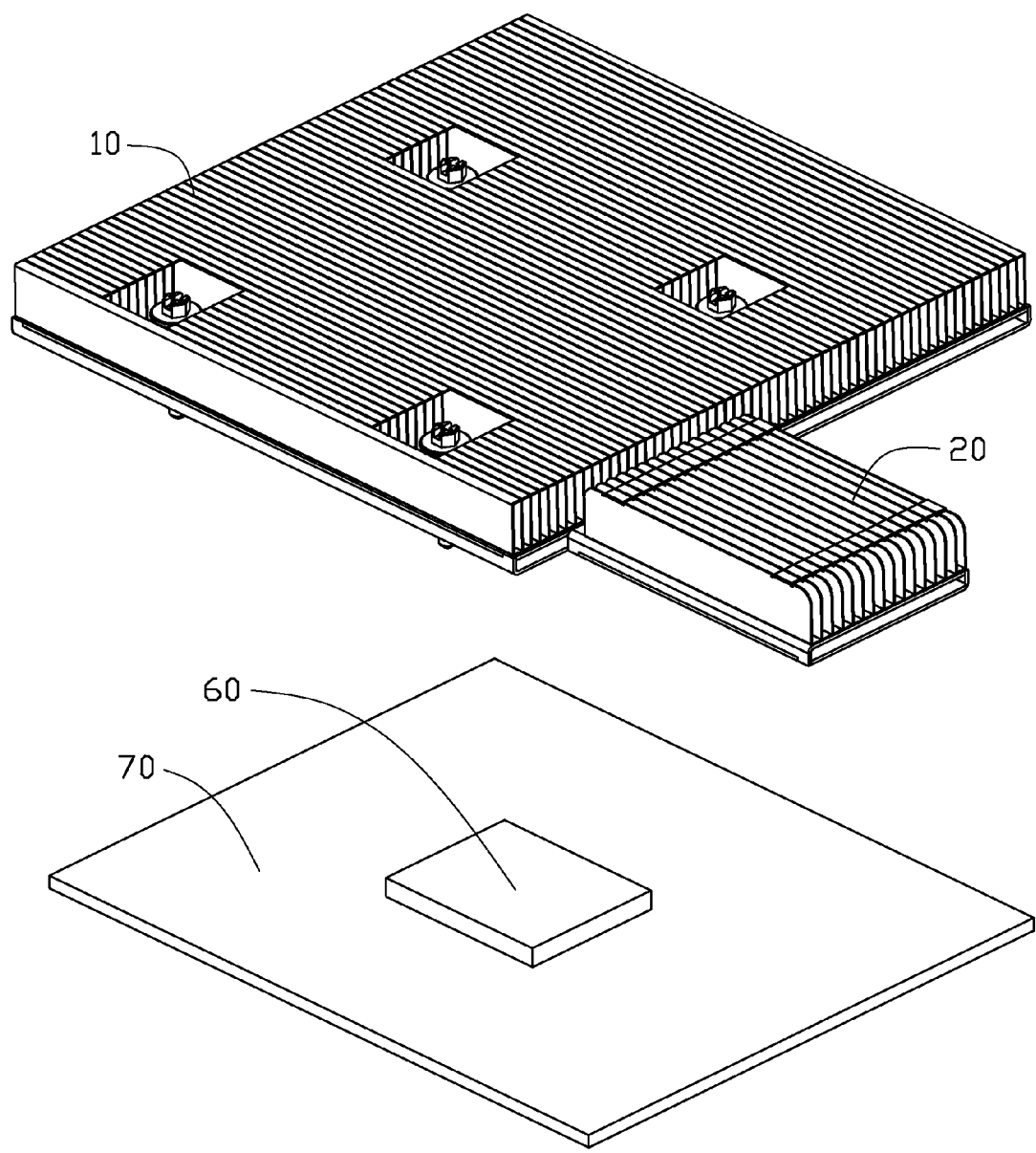
FIG. 1 is an assembled, isometric view of a heat dissipation device in accordance with an embodiment of the disclosure, with a printed circuit board and an electronic component positioned therebelow.
Figure 2:
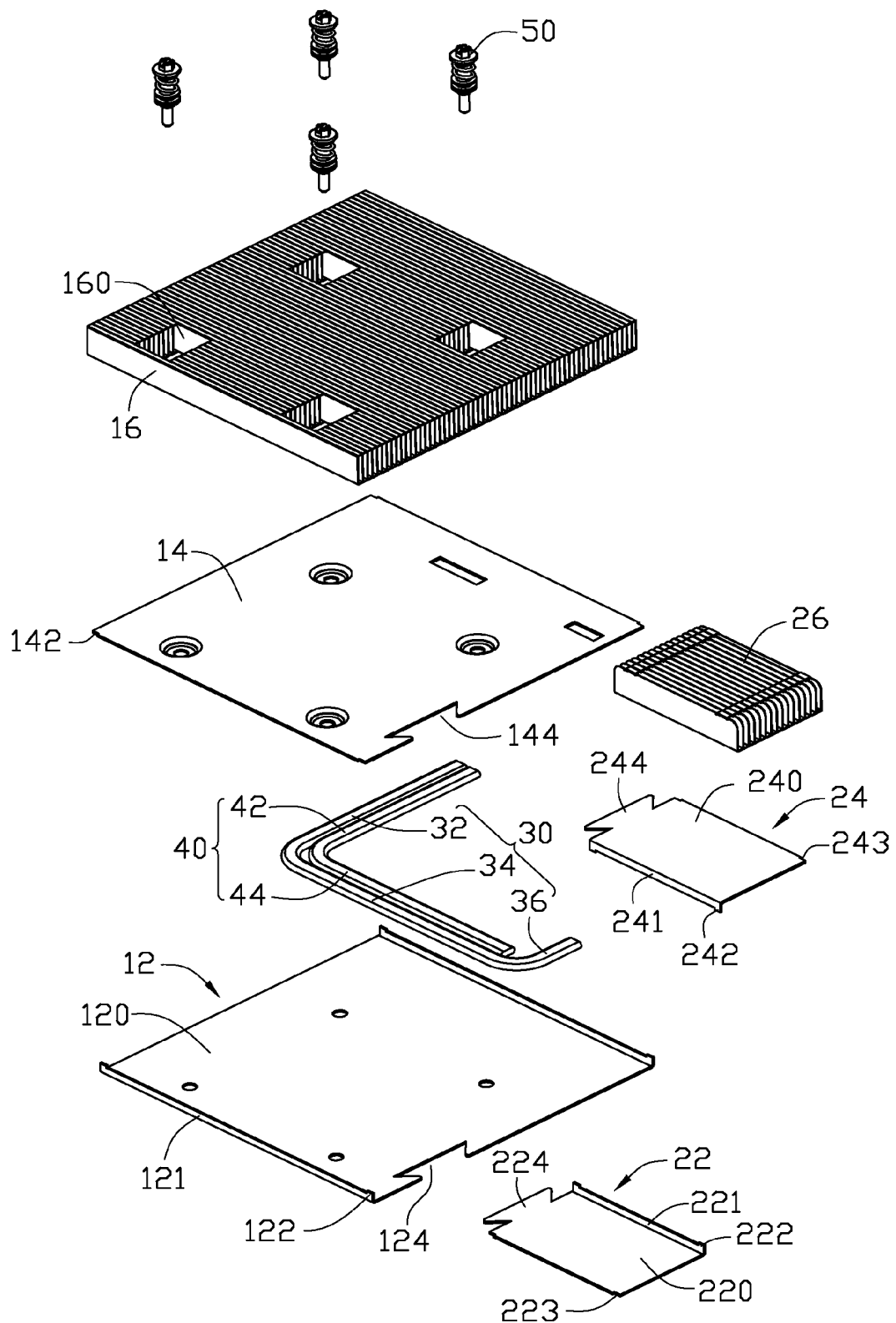
FIG. 2 is an exploded view of the heat dissipation device of FIG. 1.

Referring to FIGS. 1-2, a heat dissipation device in accordance with an embodiment of the disclosure dissipates heat generated by an electronic component 60 mounted on a printed circuit board 70. The heat dissipation device comprises a first heat sink 10 thermally contacting the electronic component 60, a second heat sink 20 located adjacent thereto, and a first heat pipe 30 and a second heat pipe 40 thermally connecting the first heat sink 10 with the second heat sink 20.

The first heat sink 10 is made of a metal with good heat conductivity, such as aluminum, copper, or an alloy thereof. The first heat sink 10 comprises a first bottom plate 12, a first top plate 14 disposed on the first bottom plate 12 and a first fin set 16 fixed to a top face of the first top plate 14.

The first bottom plate 12 is made by bending a metal plate. The first bottom plate 12 comprises a rectangular and planar first base 120 and a pair of first sidewalls 121 extending upwardly and perpendicularly from two opposite lateral sides of the first base 120, and two rectangular first protrusions 122 extending upwardly from opposite front and rear ends of each first sidewall 121, respectively. The first base 120 is attached to the electronic component 60 for absorbing heat generated therefrom. A length of the first protrusion 122 is far less than a length of the first sidewall 121.

The first top plate 14 is also made by a metal plate, and has a rectangular and planar shape similar to that of the first base 120. Two rectangular first cuts 142 are defined at opposite front and rear ends of each lateral side of the first top plate 14 corresponding to the two first protrusions 122 on each first sidewall 121 of the first bottom plate 12. A length of each first cut 142 is similar to that of each first protrusion 122, and a thickness of the first top plate 14 is essentially equal to the height of each first protrusion 122. Thus, the first protrusions 122 can substantially be retained into the first cuts 142, respectively. The first protrusions 122 of the first bottom plate 12, and the first cuts 142 of the first top plate 14 are lockable with each other for facilitating an assembly of the first heat sink 10. The first bottom plate 12 cooperates with the first top plate 14 to form a first cuboid space to accommodate parts of the first and second heat pipes 30, 40. Four holes (not labeled) are defined in each of the first top plate 14 and the bottom plate 12 for extension of four fasteners 50 through the first heat sink 10 and into the printed circuit board 70. A first cutout 124 is defined at a front side of the first base 120. A second cutout 144 having an identical configuration to that of the first cutout 124 is defined at a front side of the first top plate 14 and located just above the first cutout 124. In the present disclosure, the first and second cutouts 124, 144 each are in a shape of an isosceles trapezoid. It can be understood that the first and second cutouts 124, 144 can be made in different shapes, such as right-angled trapezoid, semicircular or coattail, as long as each of the cutouts 124, 144 has a wide inside and a narrow outside. The first and second cutouts 124, 144 cooperatively form a receiving portion 100 of the first heat sink 10.

The first fin set 16 comprises a plurality of parallel first fins, each of which consists of an upright sheet body and a pair of flanges bent horizontally from a top and a bottom of the sheet body and engaging the sheet body of an adjacent first fin. The first fin set 16 is secured on the top face of the first top plate 14 by bottom flanges of the first fins soldered to the first top plate 14. Every two adjacent first fins form a passage therebetween for allowing airflow therethrough. The first fin set 16 occupies the whole top face of the first top plate 14 except locations where the fasteners 50 are located, whereby four spaced squared through holes 160 are defined in the first fin set 16 to accommodate top portions of the four fasteners 50.

Figure 3:
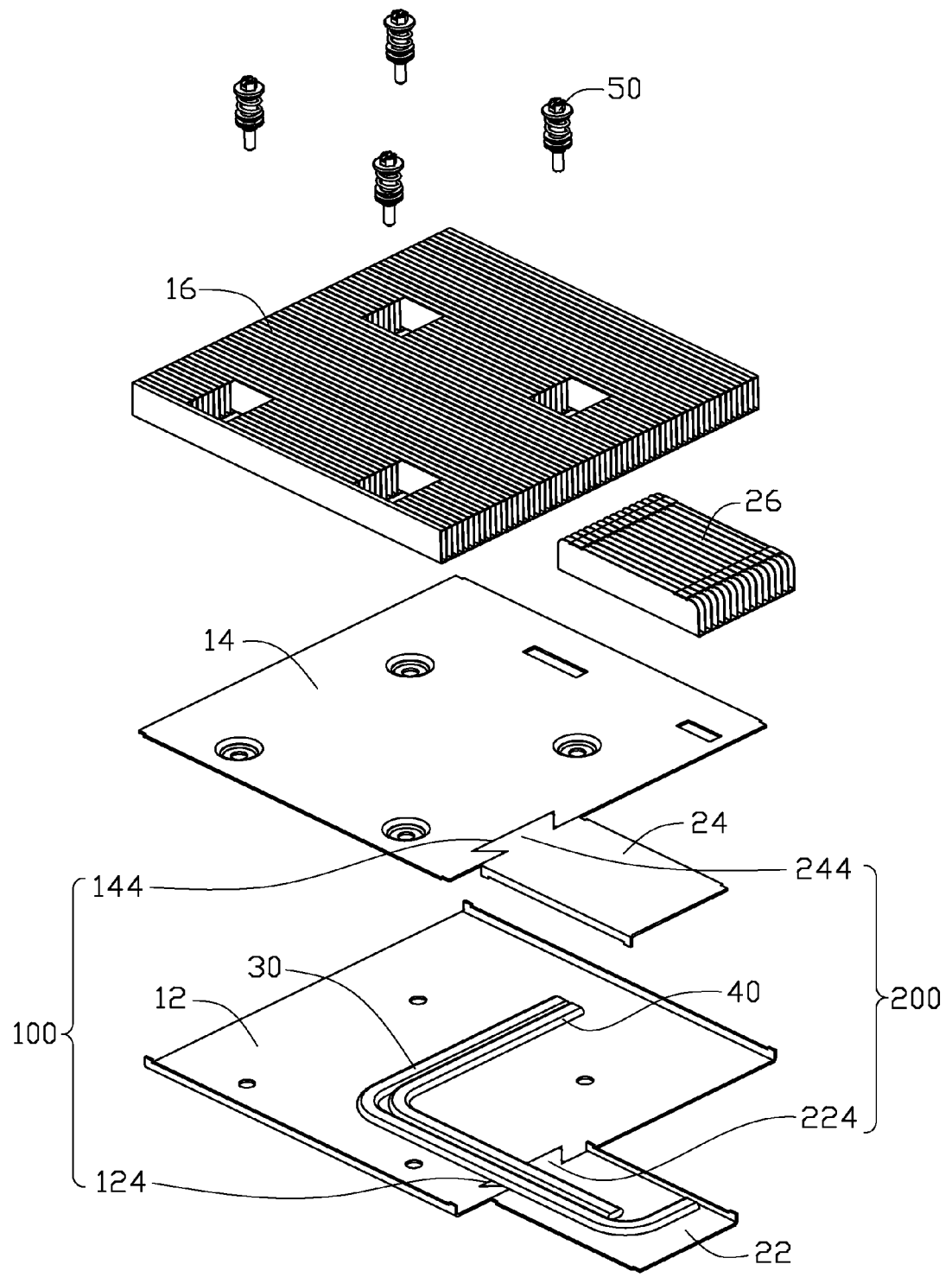
FIG. 3 is a partially exploded view of the heat dissipation device of FIG. 1.

Referring to FIG. 3 also, the second heat sink 20 is made of a metal with good heat conductivity, such as aluminum, copper, or an alloy thereof. The second heat sink 20 comprises a second bottom plate 22, a second top plate 24 disposed on the second bottom plate 22 and a second fin set 26 fixed to a top face of the second top plate 24.

The second bottom plate 22 comprises a rectangular and planar second base 220 and a second sidewall 221 extending upwardly and perpendicularly from a lateral side of the second base 220, and two rectangular second protrusions 222 extending upwardly from opposite front and rear ends of the second sidewall 221, respectively. A length of the second protrusion 222 is far less than that of the second sidewall 221. Two rectangular second cuts 223 are defined at another lateral side of the second base 220 opposite to the second sidewall 221. A first embedded portion 224 perpendicularly protrudes from a center of a rear side of the second bottom plate 22 and towards the first heat sink 10. The first embedded portion 224 and the second base 220 are integrally made from one piece metal sheet. The first embedded portion 224 has a bottom face and top face respectively coplanar with a bottom face and the top face of the second base 220. The first embedded portion 224 has a configuration complementing that of the first cutout 124 of the first base 120.

The second top plate 24 is also made by a metal plate, and is correspondingly disposed on the second bottom plate 22 and has a configuration in complement with that of the second bottom plate 22. The second top plate 24 comprises a rectangular third base 240 and a third sidewall 241 extending downwardly and perpendicularly from a lateral side of the third base 240 opposite to the second sidewall 221 of the second bottom plate 22, and two rectangular third protrusions 242 extending downwardly from opposite front and rear ends of the third sidewall 241, respectively. Two rectangular third cuts 243 are defined at another lateral side of the third base 240 opposite to the third sidewall 241. The second bottom plate 22 and the second top plate 24 have a same size. A length of the second cut 223 is similar to that of the third protrusion 242, and a thickness of the second top plate 24 is essentially equal to the height of the second protrusion 222. A length of the third cut 243 is similar to that of the second protrusion 222, and a thickness of the second bottom plate 22 is essentially equal to the height of the third protrusion 242. Thus, the second and third protrusions 222, 242 can substantially be retained into the second and third cuts 223, 243, respectively. The second protrusions 222 and cuts 223 of the second bottom plate 22, and the third protrusions 242 and cuts 243 of the second top plate 24 are also lockable with each other for facilitating an assembly of the second heat sink 20. The second bottom plate 22 cooperates with the second top plate 24 to form a second cuboid space to accommodate other parts of the first and second heat pipes 30, 40. A second embedded portion 244 perpendicularly protrudes from a center of a rear side of the second top plate 24 and towards the first heat sink 10. The second embedded portion 244 and the third base 240 are integrally made from one piece metal sheet. The second embedded portion 244 has a bottom face and top face respectively coplanar with a bottom face and top face of the third base 240. The second embedded portion 244 has a configuration complementing that of the second cutout 144 of the first top plate 14. The second embedded portion 244 has an identical configuration to that of the first embedded portion 224 and is located just above the first embedded portion 224. The first and second embedded portions 224, 244 cooperatively form an engaging portion 200 of the second heat sink 20.

The second fin set 26 comprises a plurality of parallel second fins, each of which consists of an upright sheet body and a pair of flanges bent horizontally from a top and a bottom of the sheet body and engaging the sheet body of an adjacent second fin. The second fin set 26 is secured on the top face of the second top plate 24 by bottom flanges of the second fins soldered to the second top plate 24. Every two adjacent second fins form a passage therebetween for allowing airflow therethrough. The airflow passages between the second fin set 26 communicate with those between the first fin set 16. The second fin set 26 occupies the whole top face of the second top plate 24.

It can be understood that the number of the heat pipes is adjustable according to amount of heat that the electronic component 60 generates. The first heat pipe 30 is approximately U-shaped and comprises a first evaporating section 32, a first condensing section 36 parallel to the first evaporating section 32 and a first connecting section 34 perpendicularly interconnecting the first evaporating section 32 with the first condensing section 36. The first evaporating section 32 is longer than the first condensing section 36.

The second heat pipe 40 is approximately L-shaped and comprises a second evaporating section 42 and a second condensing section 44 bent from the second evaporating section 42. The second connecting section 44 is perpendicular to the second evaporating section 42.

In assembly of the heat dissipation device, the first embedded portion 224 of the second bottom plate 22 is snugly embedded in the first cutout 124 of the first bottom plate 12; the first and second heat pipes 30, 40 are fixed to top faces of the first and second bottom bases 120, 220 and juxtaposed to each other; the first top plate 14 is disposed on the first and second heat pipes 30, 40 and engages with the first bottom plate 12; the second top plate 24 is disposed on the first and second heat pipes 30, 40 and engages with the second bottom plate 22, wherein the second embedded portion 244 of the second top plate 24 is snugly embedded in the second cutout 144 of the first top plate 14. The first and second heat pipes 30, 40 extend through the first and second embedded portions 224, 244. The first bottom plate 12 of the first heat sink 10 is coplanar with the second bottom 22 plate of the second heat sink 20; the first top plate 14 of the first heat sink 10 is coplanar with the second top plate 24 of the second heat sink 20. The first and second heat pipes 30, 40 are cooperatively sandwiched between the first bottom and top plates 12, 14, as well as between the second bottom and top plates 22, 24.

In use, according to the embodiment of the disclosure, the first and second heat pipes 30, 40 thermally connect the first heat sink 10 with the second heat sink 20. Heat generated by the electronic component 60 is absorbed by the heat sink 10 and effectively transferred to the second heat sink 20 via the first and second heat pipes 30, 40. The heat is dispersed into ambient air via the first fin set 16 and the second fin set 26, thereby preventing the electronic component 60 from overheating. Additionally, the first and second heat pipes 30, 40 extend through the engaging portion 200 of the second heat sink 20 which is securely fixed to the receiving portion 100 of the first heat sink 10, wherein the first and second embedded portions 224, 244 are firmly embedded in and lockable with the first and second cutouts 124, 144, respectively, whereby the first and second heat pipes 30, 40 can be reliably secured in position even when the heat dissipation device is subject to vibration, and protected from damage at a junction of the first heat sink 10 and the second heat sink 20 by support of the engaging portion 200 of the second heat sink 20.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:
1. A heat dissipation device comprising:
a first heat sink comprising a first bottom plate, a first top plate disposed on the first bottom plate and a first fin set fixed to a top face of the first top plate, a first cutout and a second cutout being respectively defined at a front side of the first bottom plate and the first top plate;

a second heat sink comprising a second bottom plate, a second top plate disposed on the second bottom plate and a second fin set fixed to a top face of the second top plate, a first embedded portion protruding from a rear side of the second bottom plate and embedded in the first cutout of the bottom plate of the first heat sink, a second embedded portion protruding from a rear side of the second top plate and embedded in the second cutout of the first top plate of the first heat sink; and a heat pipe connecting the first heat sink with the second heat sink, the heat pipe comprising an evaporating section sandwiched between and attached to the first bottom plate and the first top plate, a condensing section sandwiched between the second bottom plate and the second top plate, and a connecting section interconnecting the evaporating section with the condensing section, the connecting section of the heat pipe being located between and directly contacting the first and second embedded portions of the second heat sink.

2. The heat dissipation device as claimed in claim 1, wherein the second bottom plate comprises a planar second base, a second sidewall extending upwardly from a lateral side of the second base, a plurality of second protrusions extending upwardly from opposite front and rear ends of the second sidewall, and a plurality of second cuts defined at an opposite lateral side of the second base opposite to the second sidewall, the first embedded portion protruding from the second base and coplanar with the second base.

3. The heat dissipation device as claimed in claim 2, wherein the second top plate comprises a third base, a third sidewall extending downwardly from a lateral side of the third base opposite to the second sidewall of the second bottom plate, the second embedded portion protruding from the third base and coplanar with the third base, a plurality of third protrusions extending downwardly from the third sidewall, a plurality of third cuts defined at an opposite lateral side of the third base opposite to the third sidewall, and the second and third protrusions being substantially retained into the second and third cuts, respectively.

4. The heat dissipation device as claimed in claim 1, wherein the first cutout has a width decreasing towards the second heat sink, and the first embedded portion has a configuration complementing that of the first cutout of the first heat sink so as to be embedded in and lockable with the first cutout.

5. The heat dissipation device as claimed in claim 1, wherein the second cutout has a width decreasing towards the second heat sink, and the second embedded portion has a configuration complementing that of the second cutout of the first heat sink so as to be embedded in and lockable with the second cutout.

6. The heat dissipation device as claimed in claim 1, wherein the first bottom plate comprises a planar first base, a pair of first sidewalls extending upwardly from two opposite lateral sides of the first base to the first top wall, and a plurality of first protrusions extending upwardly from each first sidewall, the first cutout being defined in the first base.

7. The heat dissipation device as claimed in claim 6, wherein a plurality of first cuts are defined at two lateral sides of the first top plate corresponding to the first protrusions of the first bottom plate, and the first protrusions are substantially retained into the first cuts, respectively.

* * * * *